United States Patent
Crozier et al.

(10) Patent No.: US 9,322,871 B2
(45) Date of Patent: Apr. 26, 2016

(54) CURRENT MEASUREMENT CIRCUIT AND METHOD OF DIAGNOSING FAULTS IN SAME

(75) Inventors: Stephen Edwin Crozier, Halesowen (GB); Andrew Stephen James Williams, Warwick (GB)

(73) Assignee: TRW Limited, Solihull, West Midlands (GB)

( * ) Notice: Subject to any disclaimer, the term of this patent is extended or adjusted under 35 U.S.C. 154(b) by 1955 days.

(21) Appl. No.: 11/991,594

(22) PCT Filed: Sep. 1, 2006

(86) PCT No.: PCT/GB2006/003231
§ 371 (c)(1),
(2), (4) Date: Oct. 29, 2009

(87) PCT Pub. No.: WO2007/028960
PCT Pub. Date: Mar. 15, 2007

(65) Prior Publication Data
US 2010/0039118 A1    Feb. 18, 2010

(30) Foreign Application Priority Data

Sep. 7, 2005    (GB) .................................. 0518193.8

(51) Int. Cl.
*G01R 31/28*    (2006.01)
*G01R 19/00*    (2006.01)

(52) U.S. Cl.
CPC ........ *G01R 31/2829* (2013.01); *G01R 19/0023* (2013.01)

(58) Field of Classification Search
CPC .................. G01R 19/0023; G01R 31/2829
USPC .......................................................... 702/64
See application file for complete search history.

(56) References Cited

U.S. PATENT DOCUMENTS 3,657,660 A * 4/1972 Pfersch .................... G01L 9/06
307/650
3,920,284 A * 11/1975 Lane ...................... B60T 8/885
303/122.06
(Continued)

FOREIGN PATENT DOCUMENTS

DE    195 13 081 A1    10/1996
DE    19513081 A1    10/1996
(Continued)

OTHER PUBLICATIONS

Analog Devices, "Digitally Programmable Densor Signal Amplifier with EMI Filters, AD8556", May 2005, Analog Devices.*
(Continued)

*Primary Examiner* — Regis Betsch
(74) *Attorney, Agent, or Firm* — MacMillan, Sobanski & Todd, LLC

(57) ABSTRACT

A current measurement circuit includes first and second input nodes which receive the respective voltages at either side of a resistive element through which electrical current can flow, a differential amplifier means which produces an output signal indicative of the difference in voltage between its input terminals, electrical path forming means providing a connection between each of the input nodes and a respective input terminal of the differential amplifiers, a controllable voltage source for selectively applying an offset voltage to at least one input of the differential amplifier in response to a control signal, a control signal generator which generates the control signal applied to the voltage source such that at a first instance an offset voltage is applied which is greater than that applied at a second instance, and a diagnostic means which is adapted to identify faults present in the electrical path between the first input node and the respective input to the amplifier by comparing the output from the amplifier at the first instant when the offset voltage is applied and at the second instant without the offset voltage.

12 Claims, 2 Drawing Sheets

(56) References Cited

U.S. PATENT DOCUMENTS

| | | | |
|---|---|---|---|
| 5,501,486 A * | 3/1996 | Fujita et al. | 280/735 |
| 5,532,601 A * | 7/1996 | Weir | G01R 31/026 324/522 |
| 5,627,494 A | 5/1997 | Somerville | |
| 5,945,853 A | 8/1999 | Sano | |
| 5,995,885 A | 11/1999 | Pfeufer et al. | |
| 7,075,464 B2 | 7/2006 | Hehn | |
| 2002/0180418 A1 | 12/2002 | Jones et al. | |
| 2004/0193988 A1 * | 9/2004 | Saloio | G01D 3/08 714/742 |
| 2005/0285632 A1 * | 12/2005 | Huitsing | H03K 19/007 327/14 |

FOREIGN PATENT DOCUMENTS

| | | |
|---|---|---|
| DE | 199 08 635 A1 | 9/2000 |
| DE | 19908635 A1 | 9/2000 |
| EP | 1 600 783 A1 | 11/2005 |
| EP | 1600783 A1 | 11/2005 |
| JP | 2004-37113 | 2/2004 |
| JP | 2004037113 A | 2/2004 |

OTHER PUBLICATIONS

Search Report under Section 17 in GB0518193.8; Date of Search: Dec. 8, 2005.

International Search Report in PCT/GB2006/003231; dated Dec. 1, 2006.

* cited by examiner

CURRENT MEASUREMENT CIRCUIT AND METHOD OF DIAGNOSING FAULTS IN SAME

CROSS-REFERENCE TO RELATED APPLICATIONS

This application is a National Stage of International Application No. PCT/GB2006/003231 filed Sep. 1, 2006, the disclosures of which are incorporated herein by reference in their entirety, and which claimed priority to Great Britain Patent Application No. 0518193.8 filed Sep. 7, 2005, the disclosures of which are incorporated herein by reference in their entirety.

BACKGROUND OF THE INVENTION

This invention relates to improvements in current measurement circuits and to methods of testing the integrity of such circuits.

It is well known that the current flowing along a path in an electrical circuit can be measured by measuring the potential drop across a resistor connected in series within the path. Through the application of Ohm's Law the current is given as $I=(V_i-V_o)/R$ where $V_i$ and $V_o$ are the input and output voltages to the resistor in Volts and R is the resistance in Ohms. The measurement of potential drop is typically made by connecting the input and output side of the resistor to the positive and negative input terminals of a differential amplifier and then to a microprocessor which converts the output of the differential amplifier into a current value if required. It is also common to provide some filtering between the voltage take offs from the resistor and the inputs to the amplifier, both to remove any high frequency noise and to aid high frequency common mode rejection of the amplifier. In its simplest form this may comprise a first order low pass filter comprising a single resistor and capacitor. Even with such a low number of components failures can occur which will cause erroneous current measurements to be made.

BRIEF SUMMARY OF THE INVENTION

Therefore, according to a first aspect the invention provides a current measurement circuit, which includes:
first and second input nodes which receive the respective voltages at either side of a resistive element through which electrical current can flow,
a differential amplifier means, which produces an output signal indicative of the difference in voltage between its input terminals,
electrical path forming means providing a connection between each of the input nodes and a respective input terminal of the differential amplifier;
a controllable voltage source for selectively applying an offset voltage to at least one input of the differential amplifier in response to a control signal;
a control signal generator which generates the control signal applied to the voltage source such that at a first instance an offset voltage is applied which is greater than that applied at a second instance,
and a diagnostic means which is adapted to identify faults present in the electrical path between the first input node and the respective input to the amplifier by comparing the output from the amplifier at the first instant when the offset voltage is applied and at the second instant without the offset voltage.

The diagnostic means may produce an error signal indicating a fault in the event that the difference between the output of the amplifier at the first instant and the output at the second instant is less than a predetermined threshold level. This level may be chosen according to the values of any components in the electrical path, the expected voltage drop across the resistor etc.

The electrical path forming means may comprise a low pass filter. A separate low pass filter may be provided in each of the paths between the input side of the resistor and the amplifier and the output side of the resistor and the amplifier. It may comprise a first order filter, e.g. a single resistor and a capacitor.

The voltage source may be adapted to apply an offset voltage to just one input terminal of the amplifier, e.g. its positive or negative input, or perhaps to both input terminals. Applying an offset to only one enables the integrity of that input to be tested but not the other. Applying to both allows the integrity between the paths (a so called common mode) to be tested.

The controllable voltage source may be controlled by a single control signal, but preferably two signals are used allowing an offset voltage to be applied to the positive or negative terminals independently. This can be achieved using a voltage source that is connected to each input terminal of the amplifier through a separate switch, each switch being controlled by its own control signal. A resistor may be provided between each switch and a respective input to the amplifier to limit the current drawn from the voltage source.

The diagnostic means may be embodied within a microprocessor which may also embody the control signal generator. A program running on the processor may cause the control signals to be generated and the output signals obtained from the amplifier to be diagnosed by the processor.

The program (or an equivalent) may cause the diagnostic means and the control means to perform the following functions:

Positive input test—During this test the control signal generator produces signals which cause an offset voltage to be applied to the positive terminal at the second instant but not to the negative terminal. No offset is applied at the first instant.

Negative input test—During this test the control signal generator produces signals which cause an offset voltage to be applied to the negative terminal at the second instant but not to the positive terminal. No offset is applied at the first instant.

Common input test-During this test the control signal generator produces signals which cause an offset voltage to be applied to both the negative terminal and the positive terminal at the second instant. No offset is applied at the first instant.

The first instant may precede the second instant, or may be later. In either case they should preferably be close together to minimise any possible changes in current through the resistor that may occur. Additionally or alternatively, the predetermined limit may be defined so as to allow for any expected change in current from the first instant to the second instant.

Additionally, it should be understood that the invention may be worked with an offset being applied to the input terminals at all times, as long as a different offset is applied to one or both terminals at the second instant. It is just simpler to provide a voltage source which is either connected or held open circuit as described above.

According to a second aspect the invention provides a method of diagnosing faults present in a current sensing apparatus of the kind in which a differential amplifier produces an output indicative of the potential drop across a current sense resistor, the method comprising:
at a first instant measuring the output of the amplifier;
applying an offset voltage to at least one input of the differential amplifier at a second instant;

measuring the output of the amplifier at the second instant; and
comparing the output of the amplifier at the second instant to that at the first instant.

The method may further comprise the steps of:
applying an offset voltage to at least one other input of the differential amplifier at a third instant;
measuring the output of the amplifier at the third instant; and
comparing the output of the amplifier at the third instant to that at the first instant.

By comparing the output of the amplifier both with an offset voltage applied to its input and without (and optionally doing so for two inputs) the integrity of the input path from the sense resistor to the amplifier input can be tested.

Alternatively or additionally the method may comprise the steps of:
at a fourth instance measuring the output of the amplifier whilst an offset voltage is applied to both the positive and negative input terminals of the amplifier;
measuring the output of the amplifier at the fourth instant; and comparing the output of the amplifier at the fourth instant to that at the first instant.

The comparison may comprise determining the difference between the outputs of the amplifier at the first instant and the second (or third) instant, and in the event that the difference is less than a predetermined limit indicating a fault. It may also comprise determining the difference between the outputs of the amplifier at the first input and the fourth instant, and in the event that the difference is greater than a predetermined limit indicating a fault.

The method may be repeated at various times, for example at regular intervals, or whenever a predefined event occurs, such as turn on of the circuit containing the current sense resistor.

The method may comprise alternately connecting an input of the amplifier to a voltage source when the offset voltage is to be applied and a high impedance source (e.g. open circuit) when it is not required, or to two different voltage levels.

Other advantages of this invention will become apparent to those skilled in the art from the following detailed description of the preferred embodiments, when read in light of the accompanying drawings.

DETAILED DESCRIPTION OF THE INVENTION

Figure 1:
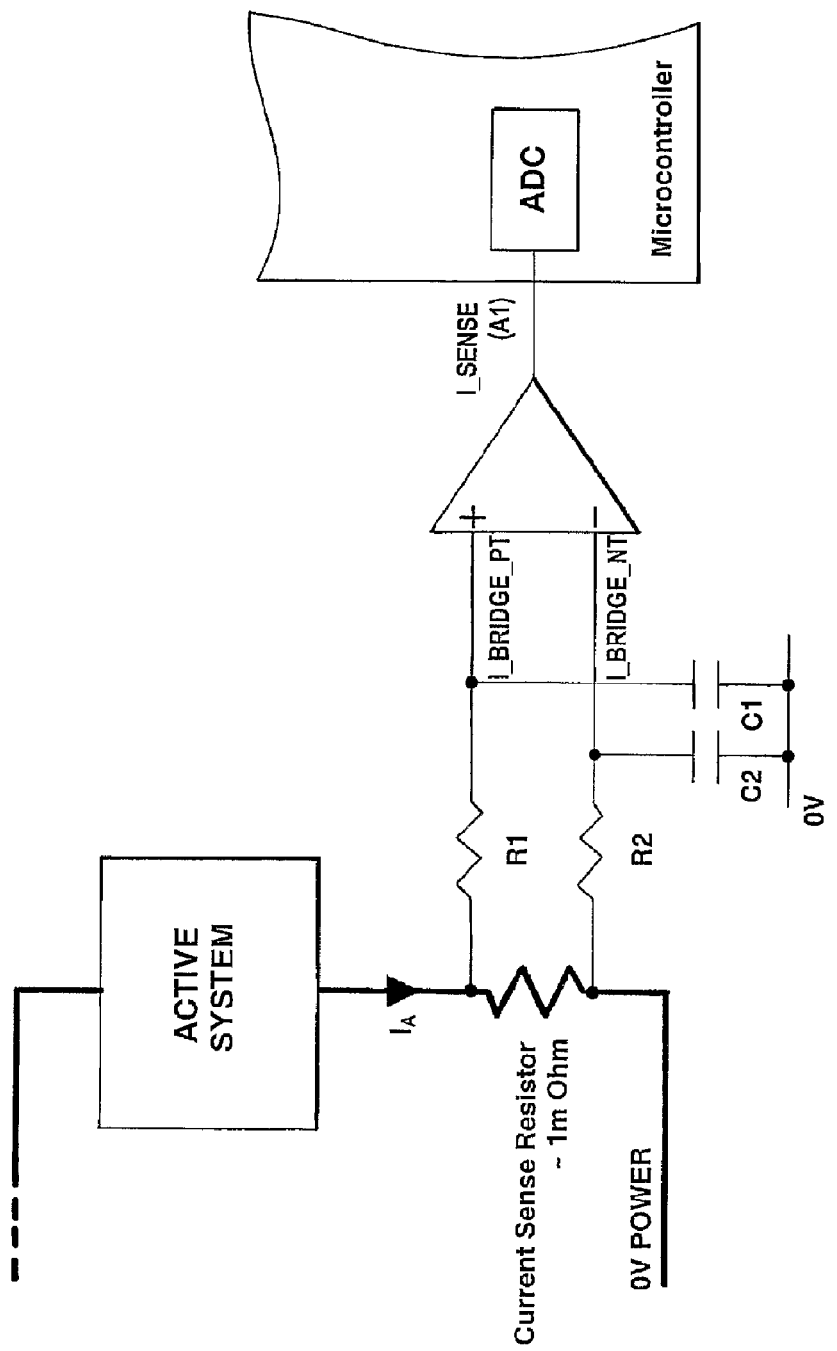
FIG. 1 is an illustration of a prior art current sensing circuit.
Figure 2:
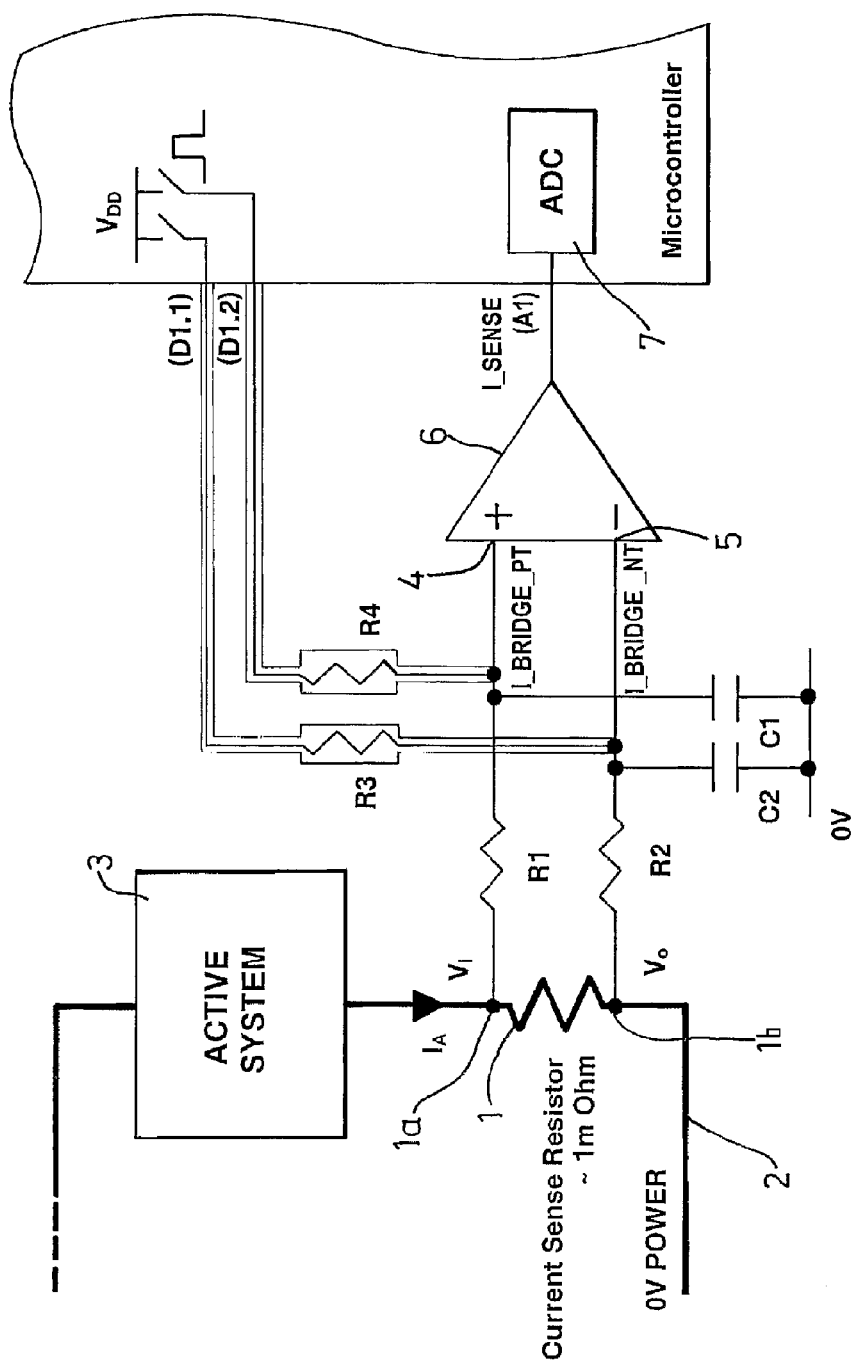
FIG. 2 is an illustration of a current sense circuit in accordance with the present invention.

The system shown in FIG. 2 is arranged to measure the current across a resistor 1 which is provided in an electrical path 2 along which the level of current is to be measured. Typically the resistor 1 is provided in the path purely for this purpose, in series with an active system 3, and will be of a high tolerance and of known resistance. It is preferred that the resistance is small so that it has little impact on the overall voltage available for the active circuit, for example of the order of 1 mOhm or less.

Two voltage inputs, $V_i$ and $V_o$ are taken from input nodes 1a, 1b on each side of the resistor 1. Each of the voltages $V_i$, $V_o$ is fed to a respective input 4, 5 of a differential amplifier 6 along an electrical path in the form of a low pass filter. For clarity the amplifier 6 is shown as a functional block, since may arrangements of amplifier can be employed within the scope of the invention.

More specifically, a first one of the electrical paths comprise a series connected resistor R1 between the voltage input Vi and the positive terminal of the amplifier, and a capacitor C1 which connects the positive terminal of the amplifier input to ground. The other one of the electrical paths comprise an identical series connected resistor R2 between the voltage output Vo and the negative terminal of the amplifier, and a capacitor C2 which connects the negative terminal of the amplifier input to ground. Such an arrangement in itself is well known in the art. Of course, more complex paths may be provided including other additional components, and the invention is not to be limited to the embodiment of FIG. 2.

In addition, a controllable voltage source $V_{DD}$ is connected through a resistance R4 to a point in the path between the resistor R1 and the positive terminal of the amplifier. This is also repeated with a connection through a further resistance R3 to a point between the resistor R2 and the negative terminal of the amplifier.

The voltage source $V_{DD}$ can be switched from a zero voltage high resistance condition to a predetermined voltage level in response to a control signal. As shown in FIG. 2, two switches are used, with each switch being driven by a respective control signal to permit the voltage to applied to one or both or none of the amplifier terminals as required.

The output of the amplifier is fed to an analogue to digital converter 7 and to a microprocessor and it is this that processes the output to determine the current through the resistor 1. The microprocessor also performs various diagnostic tests by comparing the output from the amplifier with outputs taken at different times. The following tests can be applied:

1—Positive Terminal Integrity Test

The control signal applied to the switches causes no offset voltage to be applied to the positive input at a first instant and an offset to be applied at a second instant. At neither of these times is an offset applied to the negative terminal, and measurements of the output from the amplifier are taken at both the first and second instants. The difference between the measurements at the first and second instants is determined, and if it is less than a predetermined limit the integrity of the positive input is considered to be compromised, e.g. a failure. An error flag can then be raised in the processor to indicate that the measurements are unreliable.

2—Negative Terminal Integrity Test.

This is the same as for the positive terminal integrity test except for the negative terminal. The control signal applied to the switches causes no offset voltage to be applied to the negative input at a first instant and an offset to be applied at a second instant. At neither of these times is an offset applied to the positive terminal, and measurements of the output from the amplifier are taken at both the first and second instants. The difference between the measurements at the first and second instants is determined, and if it is less than a predetermined limit the integrity of the negative input is considered to be compromised, e.g. a failure. An error flag can then be raised in the processor to indicate that the measurements are unreliable.

3—Bridge Common Mode Integrity Test

This test is similar to the positive and negative tests except that an offset voltage is present at both the positive and negative terminals at the second instant, with no offset at the first instant. A fault is indicated if the difference between the output of the amplifier at the first and the second instant is greater than a predetermined limit.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

The invention claimed is:

1. A current measurement circuit comprising:
a first input node and second input node which respectively receive a voltage from either side of a resistive element through which electrical current can flow;
a differential amplifier, which produces an output signal indicative of the difference in voltage between its input terminals;
electrical path forming means providing a connection between each of said input nodes and a respective input terminal of said differential amplifier;
a controllable voltage source for selectively applying an offset voltage to at least one input of said differential amplifier in response to a control signal;
a control signal generator which generates said control signal applied to said voltage source such that at a first instance an offset voltage is applied which is greater than the offset voltage applied at a second instance, and
a diagnostic means which identifies faults present in said electrical path between said first input node and said respective input to said amplifier by comparing the output from said amplifier at said first instant with the output at said second instant and further in which said diagnostic means produces an error signal indicating a fault in the event that said difference between the output of said amplifier at said first instant and said output at the second instant is less than a predetermined threshold level, wherein either:
said voltage source is adapted to apply an offset voltage to just one input terminal of said amplifier; or
said control means causes said circuit to perform at least one of the following functions: (a) applying an offset voltage to said positive terminal at said second instant but not to said negative terminal, and to apply no offset voltage at said first instant; (b) applying an offset voltage to said negative terminal at said second instant but not to said positive terminal, and to apply no offset voltage at said first instant; and (c) applying an offset voltage to both said positive terminal and said negative terminal at said second instant but apply no offset voltage at said first instant.

2. The circuit according to claim 1 wherein said electrical path forming means comprises a low pass filter.

3. The circuit according to claim 1 wherein said voltage source is adapted to apply an offset voltage to just one input terminal of said amplifier.

4. The circuit according to claim 1 wherein said controllable voltage source is controlled by a single control signal.

5. The circuit according to claim 1 wherein said controllable voltage source is controlled by at least two signals allowing an offset voltage to be independently applied to said positive terminal and said negative terminal.

6. The circuit according to claim 1 wherein said diagnostic means is embodied within a microprocessor which also embodies said control signal generator, a program running on said microprocessor causing said control signals to be generated and said output signals obtained from said amplifier to be diagnosed by said processor.

7. The circuit according to claim 1 wherein said control means causes said circuit to perform at least one of the following functions:
(a) applying an offset voltage to said positive terminal at said second instant but not to said negative terminal, and to apply no offset voltage at said first instant;
(b) applying an offset voltage to said negative terminal at said second instant but not to said positive terminal, and to apply no offset voltage at said first instant;
(c) applying an offset voltage to both said positive terminal and said negative terminal at said second instant but apply no offset voltage at said first instant.

8. The circuit according to claim 7 wherein said error signal is provided when the difference between the output of said amplifier at said second instant resulting from one of functions (a) and (b) and the output of said amplifier at said first instant is less than said predetermined threshold.

9. The circuit according to claim 1 wherein said error signal is provided when the difference between the output of said amplifier at said second instant and the output of said amplifier at said first instant is less than said predetermined threshold.

10. A method of diagnosing faults present in a current sensing apparatus including a differential amplifier having a positive input and a negative input, the differential amplifier also having an output and being operable to produce an output indicative of a potential drop across a current sense resistor connected through respective electrical paths to the positive and negative inputs, the method comprising the following steps:
(a) measuring the output of the amplifier at a first instant;
(b) applying an offset voltage to at least one input of the differential amplifier at a second instant, wherein the offset voltage is applied to only one input of the differential amplifier at the second instant;
(c) measuring the output of the amplifier at a second instant;
(d) comparing the output of the amplifier at the second instant to that at the first instant; and
(e) determining the difference between the outputs of the amplifier that are compared in step (d) and comparing the resulting difference to a predetermined limit to determine whether a fault in at least one of the electrical paths from the current sense resistor to the positive and negative inputs should be indicated, and wherein a fault is indicated upon the difference being less that the predetermined limit for indicating a fault.

11. The method according to claim 10 wherein, during step (b), the offset voltage is applied to both inputs of the differential amplifier at the second instant and further wherein, during step (e) a fault is indicated upon the difference being greater that the predetermined limit for indicating a fault.

12. The method according to claim 10 wherein said error signal is provided when the difference between the output of said amplifier at said second instant resulting from function (c) and the output of said amplifier at said first instant is greater than said predetermined threshold.

* * * * *